United States Patent
Linn et al.

(10) Patent No.: US 7,052,973 B2
(45) Date of Patent: *May 30, 2006

(54) BONDED SUBSTRATE FOR AN INTEGRATED CIRCUIT CONTAINING A PLANAR INTRINSIC GETTERING ZONE

(75) Inventors: Jack H. Linn, Melbourne, FL (US); William H. Speece, Palm Bay, FL (US); Michael G. Shlepr, Palm Bay, FL (US); George V. Rouse, Indialantic, FL (US)

(73) Assignee: Intersil Americas Inc., Milpitas, CA (US)

( * ) Notice: Subject to any disclaimer, the term of this patent is extended or adjusted under 35 U.S.C. 154(b) by 109 days.

This patent is subject to a terminal disclaimer.

(21) Appl. No.: 10/811,617

(22) Filed: Mar. 29, 2004

(65) Prior Publication Data

US 2004/0180512 A1 Sep. 16, 2004

Related U.S. Application Data

(60) Continuation of application No. 09/846,795, filed on May 1, 2001, now Pat. No. 6,825,532, which is a division of application No. 09/255,231, filed on Feb. 22, 1999, now Pat. No. 6,255,195.

(51) Int. Cl.
*H01L 21/46* (2006.01)
*H01L 21/30* (2006.01)

(52) U.S. Cl. .................... 438/455; 438/473
(58) Field of Classification Search ............. 438/455, 438/473
See application file for complete search history.

(56) References Cited

U.S. PATENT DOCUMENTS

| | | | |
|---|---|---|---|
| 4,608,096 A | 8/1986 | Hill | |
| 5,063,113 A | 11/1991 | Wada | |
| 5,229,305 A | 7/1993 | Baker | |
| 5,334,273 A | 8/1994 | Short et al. | |
| 5,374,564 A | 12/1994 | Bruel | |
| 5,661,044 A | 8/1997 | Holland et al. | |
| 5,731,637 A | 3/1998 | Hori et al. | |
| 5,882,987 A | 3/1999 | Srikrishnan | |
| 6,046,095 A | 4/2000 | Horikawa | |
| 6,083,324 A | 7/2000 | Henley et al. | |
| 6,245,161 B1 | 6/2001 | Henley et al. | |

*Primary Examiner*—Asok Kumar Sarkar
(74) *Attorney, Agent, or Firm*—Fogg and Associates, LLC; Scott V. Lundberg

(57) ABSTRACT

A bonded semiconductor-on-insulator substrate for an integrated circuit. The bonded semiconductor-on-insulator substrate includes a wafer, a handle wafer and an insulating bond layer. The wafer has a first layer of monocrystalline semiconductor material adjacent a first surface of the wafer. The wafer also has a second layer of undamaged by implantation monocrystalline semiconductor material adjacent a second surface of the wafer. The wafer further has a substantially planar intrinsic gettering zone of substantially pure semiconductor material and active gettering sites positioned between the first and second layers formed by implanting ions of the semiconductor material through the first layer of monocrystalline semiconductor material. The insulating bond layer bonds the handle wafer to the first surface of the wafer.

18 Claims, 4 Drawing Sheets

US 7,052,973 B2

BONDED SUBSTRATE FOR AN INTEGRATED CIRCUIT CONTAINING A PLANAR INTRINSIC GETTERING ZONE

CROSS REFERENCE TO RELATED APPLICATIONS

This application is a continuation application of U.S. patent application Ser. No. 09/846,795, filed May 1, 2001 now U.S. Pat. No. 6,825,532, which is a divisional of U.S. application Ser. No. 09/255,231, filed Feb. 22, 1999 now U.S. Pat. No. 6,255,195.

FIELD OF THE INVENTION

The present invention relates to gettering in a semiconductor device and, more particularly, to a process for forming a bonded semiconductor-on-insulator substrate containing a planar intrinsic gettering zone and to a semiconductor device and an integrated circuit formed on the bonded substrate.

BACKGROUND OF THE INVENTION

During integrated circuit manufacture and processing, a silicon wafer may be exposed to metallic contaminants such as iron, nickel, zinc, chrromium, and the like that may ultimately degrade the final product yield, performance, or reliability. This contamination may occur through contact with stainless steel wafer handlers and tools, diffusion of metallic substances from beater coils or lamps in high temperature processing chambers, or sputter debris dislodging from plasma chamber walls.

Gettering is a term that refers generally to any mechanism by which contaminating impurities, typically transition metals, are removed from sensitive semiconductor device regions and entrapped in other relatively benign domains of the wafer Gettering is described in Wolf and Tauber, *Silicon Processing in the VLSI Era*, Vol. 1, 1986, Lattice Press, pp 61–70.

Gettering typically proceeds in three steps: 1) release of a contaminating element from its originating stable state and locale in the wafer into solid solution in the semiconductor crystal lattice, 2) diffusion of the contaminant through the crystal away from sensitive device structures or areas where susceptible structures are ultimately to be formed, and 3) capture of the contaminants by extended defects such as dislocations or precipitates at a position far enough away from devices to avoid interference with their operation and stable enough to prevent future liberation or discharge into the wafer during ensuing thermal, chemical and plasma treatments.

There are two basic categories of gettering mechanisms: extrinsic, or external, and intrinsic, or internal. These categories are discussed in U.S. Pat. No. 4,608,096 to Hill, the disclosure of which is incorporated herein by reference.

Extrinsic gettering entails the use of external means (usually on the wafer back surface) to create damage or stress in the silicon lattice, leading to the creation of extended defects capable of mobile metal capture. Examples of extrinsic gettering approaches include: diffused backside phosphorus or arsenic doping to tie up nickel, gold, iron, copper, etc., and mechanical or physical backside wafer damage produced by abrasion, grooving, sandblasting, laser deformation, ion implantation, polysilicon deposition, etc.

Intrinsic gettering is typically accomplished by the localized capture of impurities at extended defects that exist within the bulk material of the silicon wafer, for example, a Czochralski grown monocrystalline wafer containing interstitial oxygen (5–25 ppma). Intrinsic gettering usually involves the supersaturation of a region or zone of the silicon wafer with oxygen that will separate from solid solution and form clusters of silicon dioxide during thermal treatment. The stresses resulting from the agglomerate clusters cause stacking faults and dislocation loops that are capable of trapping impurities. To be effective, the clusters must be formed in the bulk of the wafer away from active device sites. Oxygen levels above the precipitation threshold must therefore be avoided in regions where active devices will be later be formed and permanently reside.

Various approaches have been taken in the past to provide gettering regions in a bonded semiconductor-on-insulator substrate. For example, in U.S. Pat. No. 5,063,113 to Wada, the disclosure of which is incorporated herein by reference, defects for gettering sites are induced in a semiconductor layer by thermal treatment. However the defects are distributed vertically throughout the layer, extending even to the exterior surface, where they may adversely affect bonding of the layer with other layers. In addition, grinding and polishing of the layer results in substantial loss of the gettering sites.

U.S. Pat. No. 5,229,305 to Baker, the disclosure of which is incorporated herein by reference, describes a method for implanting boron, argon, krypton or, preferably, oxygen ions into a polished surface of a semiconductor layer, followed by thermal treatment, to create gettering sites in the layer. The polished surface of the semiconductor layer is then bonded to a handle substrate. Baker does not show implanting silicon ions into the silicon substrate. To create a high density gettering zone, Baker requires a large implant dose. Such a dose of non-semiconductor ions would alter the electrical characteristics of the semiconductor substrate.

Commonly employed gettering techniques are inadequate for use with many desired semiconductor devices. For example, the formation of gettering sites by treatment of the back surface of a device is generally unsuited for application to semiconductor-on-insulator structures. Also, defects that provide gettering sites are often generated in an indiscriminate, scattered fashion throughout the wafer and may thus adversely affect the performance of a device subsequently formed in the wafer.

There is a need for a method for making a bonded semiconductor-on-insulator substrate for integrated circuits that includes a high quality semiconductor device wafer having a smooth surface to promote its bonding integrity to a handle wafer and containing a well-defined, restricted intrinsic gettering zone close to but not detrimentally overlapping sites of devices that are particularly susceptible to metal contamination. There is a further need for a semiconductor substrate whose electrical characteristics are substantially unchanged by the formation of a gettering zone therein. The present invention meets these needs.

SUMMARY OF THE INVENTION

The present invention is directed to a method for forming a bonded semiconductor-on-insulator substrate for the fabrication of semiconductor devices and integrated circuits. Into a surface of a wafer of a monocrystalline semiconductor material, ions of the semiconductor material are implanted to a selected depth in the wafer to form, adjacent to the surface, an amorphous layer of the semiconductor material. The layer of amorphous semiconductor material extends to a substantially planar zone disposed at substantially the selected depth and comprising the monocrystalline semiconductor material damaged by lattice defects, i.e., end-of-range implant damage. Undamaged material below the selected depth comprises a first layer of the monocrystalline semiconductor material.

The wafer is heated under conditions effective to convert the amorphous layer to a second layer of the monocrystalline semiconductor material and to coalesce the zone of damaged monocrystalline semiconductor material, thereby forming a substantially planar intrinsic gettering zone of substantially pure semiconductor material that includes active gettering sites disposed at substantially the selected depth.

An insulating bond layer on one surface of a handle wafer is bonded to the surface of the wafer to form a bonded semiconductor-on-insulator substrate comprising a handle wafer, an insulating bond layer, and a device wafer of monocrystalline semiconductor material. The device wafer includes a substantially planar intrinsic gettering zone comprising substantially pure semiconductor material and including active gettering sites.

Also in accordance with the present invention is a bonded semiconductor-on-insulator substrate that includes a wafer comprising two layers of a monocrystalline semiconductor material separated by a planar intrinsic gettering zone that comprises substantially pure semiconductor material and contains active gettering sites. Further in accordance with the invention is a semiconductor device or integrated circuit formed on the described substrate.

The bonded substrate of the present invention includes a narrowly restricted gettering zone located in near proximity to device regions, which increases the efficiency of contaminant removal from those regions and facilitates small geometry manufacture. Because the gettering zone comprises substantially pure semiconductor material, its formation affects only the structural characteristics and not the electrical characteristics of the wafer. The bonded substrate of the invention is reliably constructed and provides excellent structural stability to devices formed on it over a wide range of processing temperature and conditions.

DETAILED DESCRIPTION OF THE INVENTION

Figure 1:
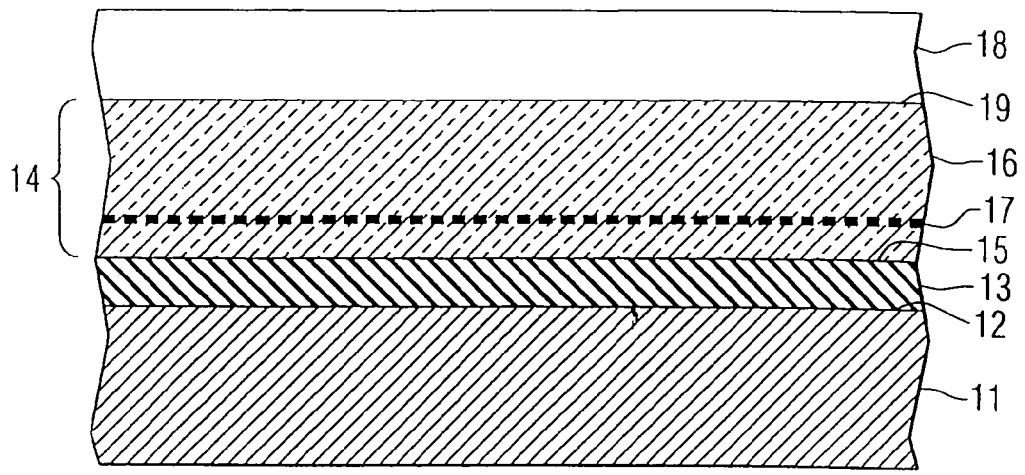
FIG. 1 is a schematic cross-section of the bonded semiconductor-on-insulator substrate of the present invention.

Referring to FIG. 1, a bonded substrate 10 of the present invention includes a handle wafer 11 having on one surface 12 an insulating bond layer 13 and a semiconductor device wafer 14 bonded to insulating layer 13. Semiconductor device wafer 14 has a first layer 15 of monocrystalline semiconductor material adjacent to insulating layer 13 and a second layer 16 of monocrystalline semiconductor material overlying first layer 15. Second monocrystalline semiconductor layer 16 is separated from first monocrystalline semiconductor layer 15 by an intervening substantially planar intrinsic gettering zone 17 comprising gettering sites in the monocrystalline semiconductor material. A further optional epitaxial monocrystalline semiconductor layer 18 can be deposited on surface 19 of layer 16.

Figure 2A:
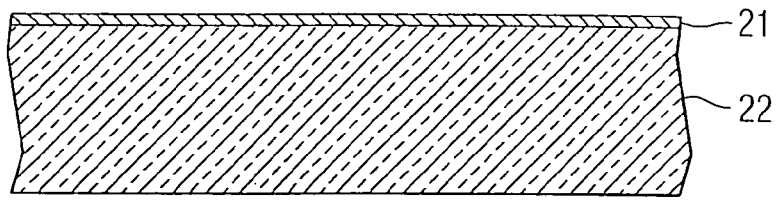
FIGS. 2A–F is a schematic representation of the steps of forming a device wafer containing a planar intrinsic gettering zone.
Figure 2B:
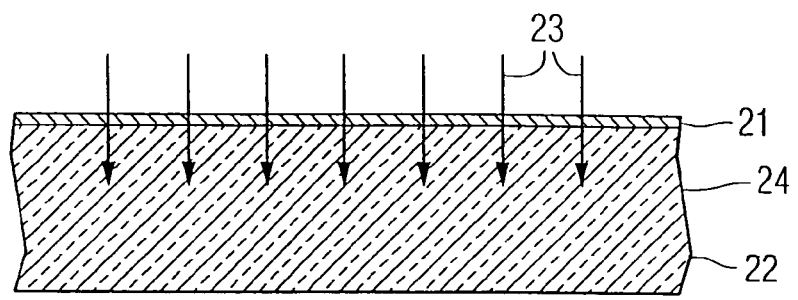

FIGS. 2A–F depict the method of the invention for forming the device wafer 14 shown in FIG. 1. As depicted in FIG. 2A, an oxide layer 21 having a thickness preferably of about 1 nm to about 50 nm is optionally formed on a wafer 22 of monocrystalline semiconductor material. The oxide of layer 21 may be a native oxide, a chemically grown oxide, a thermally grown oxide, or a deposited oxide. Ions 23 of the semiconductor material at a dose of about $10^{14}$ to $10^{18}$ ions/cm$^2$ are implanted, through oxide layer 21 if present, to a selected depth 24 in wafer 22, as shown in FIG. 2B. The depth 24 of ion implantation can be controlled by the energy employed; for example, about 185 keV causes implantation of silicon ions at a depth 24 of about 0.4 µm, while a lower energy of about 90 keV results in a depth 24 of about 0.2 µm. In accordance with the present invention, the depth of ion implantation in the monocrystalline semiconductor wafer preferably is about 0.1 µm to 2.0 µm, preferably about 0.2 µm to 0.6 µm, and the implantation energy preferably is about 50 keV to 250 keV. Ion implantation is well described in Giles, "Ion Implantation," Chapter 8 in Sze, editor, *VLSI Technology*, Second Edition, McGraw-Hill, Inc., 1988, the disclosure of which is incorporated herein by reference.

Figure 2C:
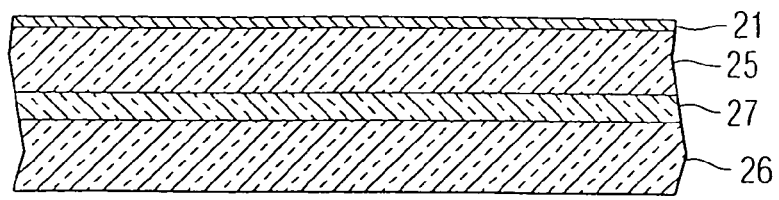
Figure 2D:
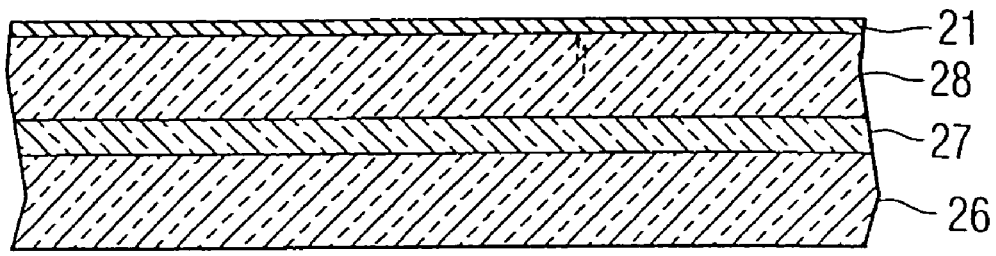

As depicted in FIG. 2C, ion implantation results in formation of an amorphous semiconductor layer 25. If oxide layer 21 is present, amorphous layer 25 may contain oxygen atoms that originated from layer 21. A layer 26 of undamaged monocrystalline semiconductor material is separated from amorphous layer 25 by a substantially planar latent getter zone 27 of monocrystalline semiconductor material containing lattice defects, i.e., end-of-range implant damage. Amorphous layer 25 is heated under conditions effective to convert it by solid phase epitaxial annealing to a layer 28 of monocrystalline semiconductor material, as shown in FIG. 2D. The annealing of amorphous layer 25 to produce monocrystalline semiconductor layer 28 is achieved by heating to a temperature of about 450° C. to 1200° C. for about 15 minutes to 8 hours, preferably about 550° C. to 620° C. for about 2 hours to 6 hours in a non-oxidizing atmosphere such as nitrogen, argon, or hydrogen. Annealing removes from layer 28 sufficient oxygen to preclude the formation of defect sites.

Further heating at about 800° C. to 1200° C. for about 1 hour to 6 hours, preferably about 1000° C. to 1150° C. for about 2 hours to 4 hours, causes coalescence of zone 27 of monocrystalline semiconductor material damaged by lattice defects to form a gettering zone 17 containing active gettering sites. It must be emphasized that gettering zone 17, unlike that described in the previously mentioned U.S. Pat. No. 5,229,305, comprises substantially pure semiconductor material containing dislocations that provide active gettering sites. Because implantation is carried out with ions 23 of the semiconductor material, e.g., silicon ions, no dopants or other contaminants that can affect the electrical properties of the semiconductor wafer 14 are introduced during ion implantation.

Figure 2E:
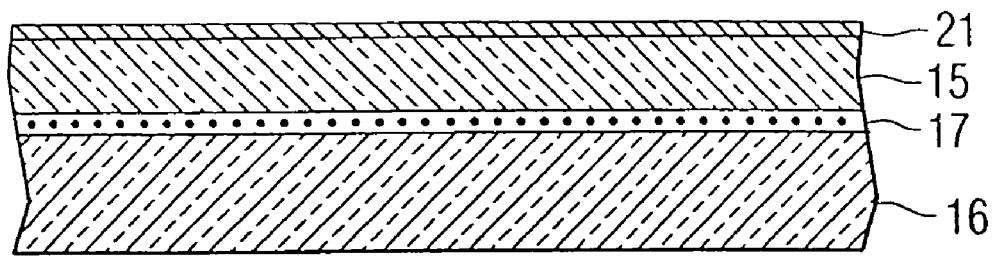

The annealing of layer 25 and the coalescence of zone 27 can be carried out in a single step under effective temperature-time conditions, but it is preferred that a two-stage procedure first at lower temperature, then at higher be employed. The coalescence of zone 27 produces a substantially planar intrinsic gettering zone 17 separating a first layer 15 and a second layer 16, each comprising monocrystalline semiconductor material, as depicted in FIG. 2E. Zone 27 can have an initial thickness of about 0.2 μm to 0.4 μm, coalescing to form a gettering zone 17 having a thickness of about 0.05 μm to about 0.2 μm, preferably about 0.1 μm. First monocrystalline semiconductor layer 15 has a thickness of about 0.1 μm to about 0.8 μm, preferably about 0.2 μm to about 0.4 μm. Second monocrystalline semiconductor layer 16, which is much thicker than layer 15, can have a thickness of 100 μm or greater prior to being thinned to a desired final thickness of about 0.2 μm to 20 μm.

Figure 2F:
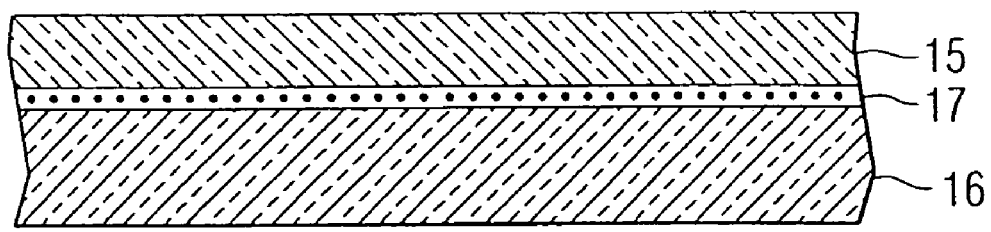

Removal of oxide layer 21, if present, produces device wafer 14, as shown in FIG. 2F.

It should be noted that the structure of wafer 14 as shown in FIG. 2F is inverted relative to its orientation in FIG. 1.

Figure 3:
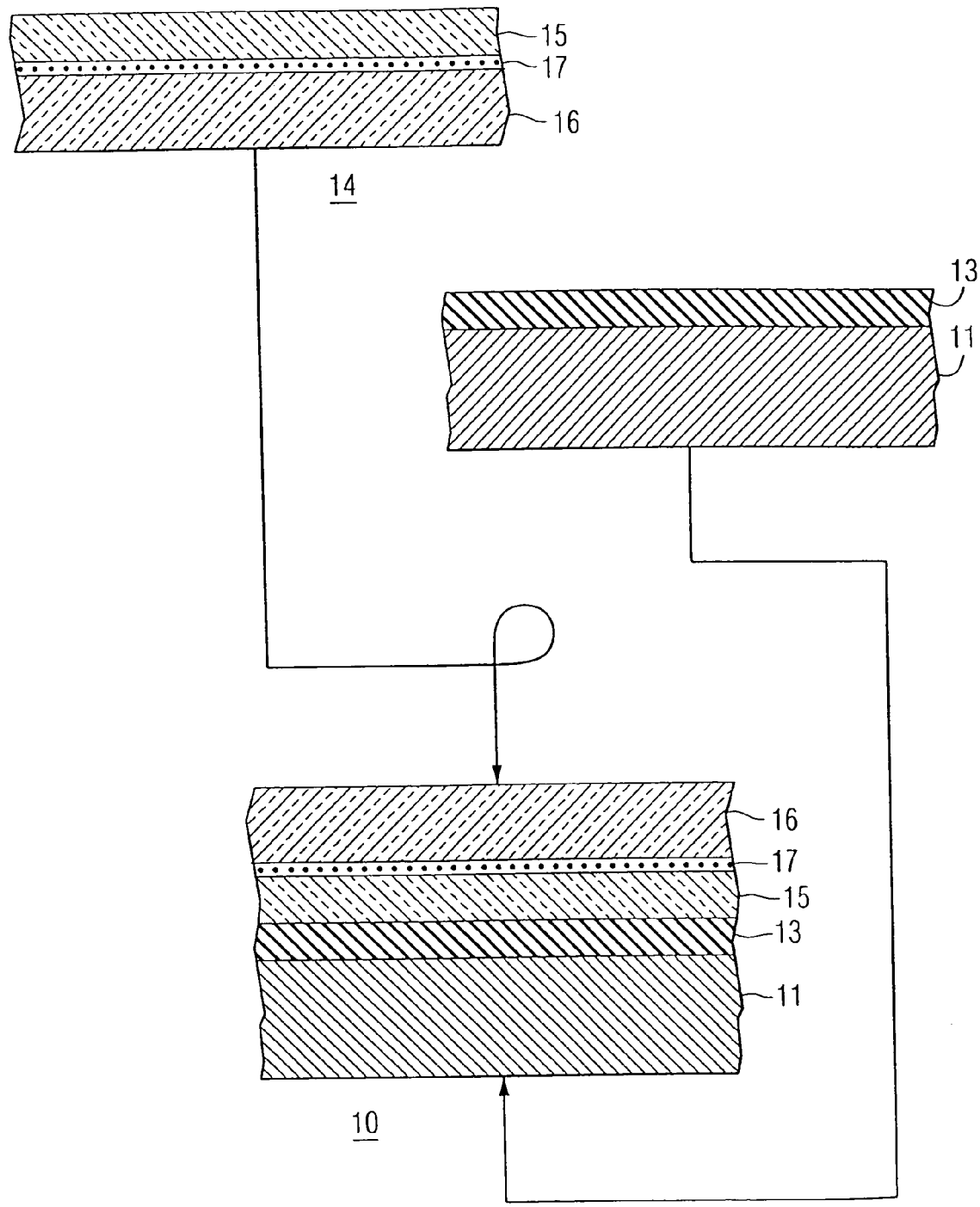
FIG. 3 is a schematic representation of the bonding of a handle wafer and a device wafer containing a planar intrinsic gettering zone to form the bonded substrate of the present invention.

FIG. 3 is a schematic representation of the formation of the bonded semiconductor-on-insulator substrate of the present invention by inverting device wafer 14, as shown in FIG. 2F, and bonding it to insulating bond layer 13 on handle wafer 11. Following bonding of wafer 14 to layer 12, thick second monocrystalline semiconductor layer 16 can be thinned to a desired thickness. An epitaxial monocrystalline semiconductor layer 18 can be deposited on thinned layer 16, as shown in FIG. 1, and active devices can be fabricated within epitaxial layer 18.

Those skilled in the art will appreciate that the planar gettering zone 17 can be precisely positioned at a depth 24 within device wafer 14. Likewise, the thickness of second monocrystalline semiconductor layer 16 can be controlled by chemical or mechanical material removal means, including etching, lapping, grinding, and polishing. As a result, gettering zone 17 can also be precisely positioned with respect to devices formed on the surface 19 of layer 16 or in epitaxial layer 18.

The method of the present invention is applicable to any substrate having a semiconductor-on-insulator structure. Preferably, however, the semiconductor material comprising device wafer 14 is monocrystalline silicon, in which gettering zone 17 is produced by implanting silicon ions 23 through a layer 22 of silicon dioxide. Semiconductor material comprising device wafer 14 can further be germanium, and gettering zone 17 can be produced by implanting germanium ions 23 through a layer 22 of germanium oxide.

Handle wafer 11 can be formed from a metal, an insulator, silicon carbide, polysilicon or, preferably, monocrystalline silicon. Insulating bond layer can be formed of any insulating material but preferably comprises silicon dioxide. Thus, the method of the present invention is especially useful for forming silicon-on-insulator (SOI) bonded substrates on which semiconductor devices and integrated circuits can be fabricated.

Figure 4:
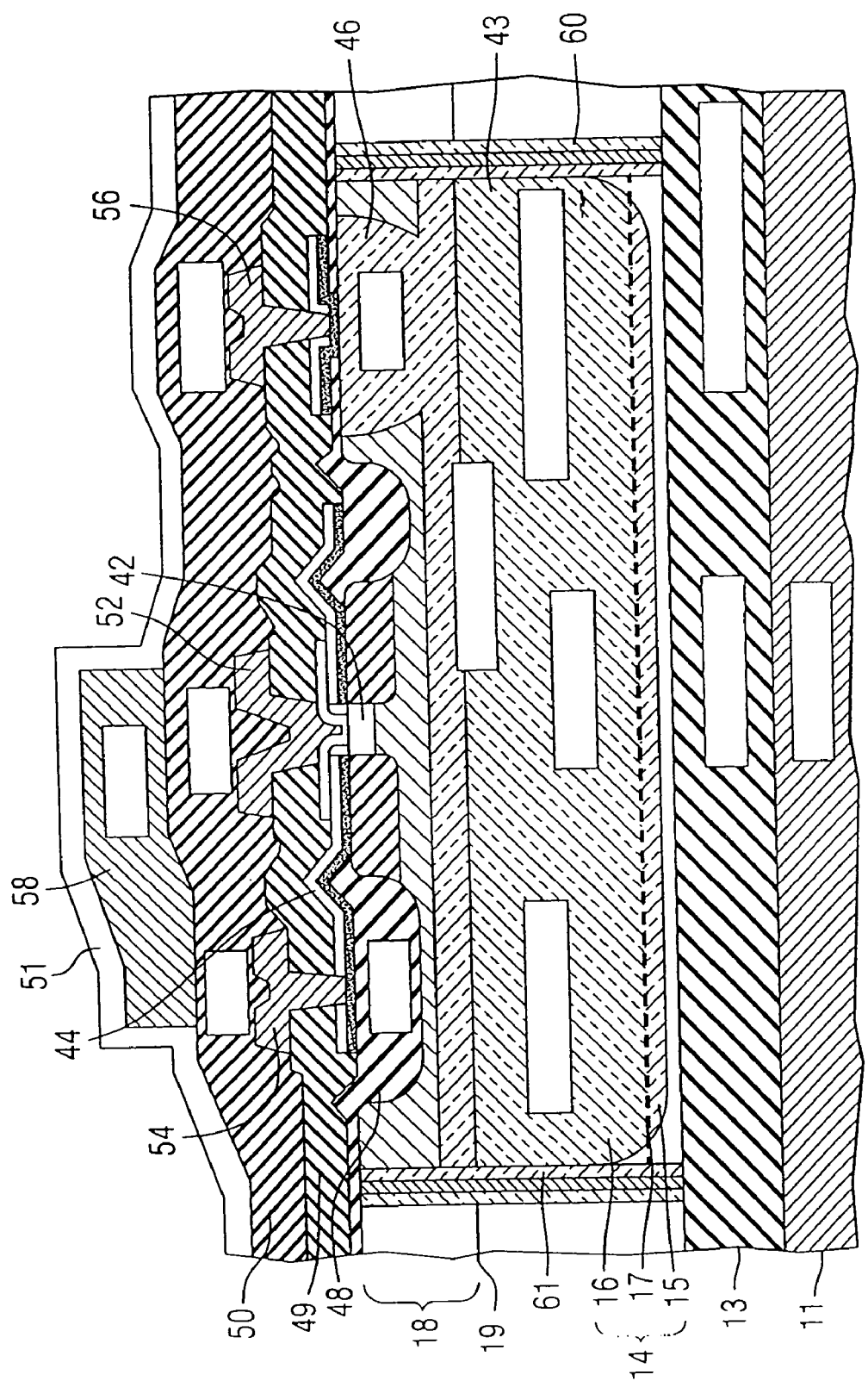
FIG. 4 is a schematic cross-section of a bipolar junction transistor (BJT) formed on the bonded substrate of the present invention.

FIG. 4 schematically depicts the cross-section of a bipolar junction transistor (BJT) 40 formed in an epitaxial layer 18 formed on a bonded SOI substrate 10 containing a planar intrinsic gettering zone 17 in accordance with the present invention. Transistor 40 includes an emitter diffusion 42, a base diffusion 44, and a collector sinker diffusion 46. The polarity of emitter diffusion 42 and sinker diffusion 46 are the same, i.e., n or p, the polarity of base diffusion 44 being the opposite, i.e., p or n. Sinker diffusion 46 is connected to a buried layer 43 in a manner well known in the art. Insulating layers 48, 49, 50 isolate the respective metal contacts 52, 54, 56 for emitter, base, and sinker diffusions 42, 44, 46. Surface insulator 51 protects an interconnect metal line 58 and otherwise seals the surface of transistor 40. Lateral isolation trenches 60, 61, which have oxide sidewalls and are filled with polysilicon, extend from the surface of transistor 40 to buried oxide insulating layer 13 and serve to isolate transistor 40 from adjacent devices.

In addition to BJTs, many other types of devices can be constructed on the bonded substrate of the present invention: resistors, capacitors, diodes, field effect transistors (FETs), including junction and MOSFETs, thyristors, and the like.

The invention has been described in detail for the purpose of illustration, but it is understood that such detail is solely for that purpose, and variations can be made therein by those skilled in the art without departing from the spirit and scope of the invention, which is defined by the following claims.

What is claimed is:

1. A method of forming a semiconductor device comprising:
    implanting ions through a first surface of a monocrystalline semiconductor material to a selected depth forming an amorphous layer adjacent the first surface;
    heating the semiconductor material under conditions effective to coalesce a substantially planer zone formed by the implantation of ions through the first surface of the semiconductor material to form a gettering zone and further to convert the amorphous layer to a first layer of semiconductor material forming an insulating bond layer on a surface of the handle wafer; and
    bonding the insulating bond layer to the first surface of the semiconductor material.

2. The method of claim 1, wherein implanting ions through a first surface of the monocrystalline semiconductor material to a selected depth further comprises:
    implanting ions of the semiconductor material.

3. The method of claim 1, wherein implanting ions through a first surface of the monocrystalline semiconductor material to a selected depth further comprises:
    implanting silicon ions.

4. The method of claim 1, further comprising:
    forming devices in a second layer of semiconductor material to form an integrated circuit, wherein the second layer of semiconductor material has not been exposed to ion implantation.

5. The method of claim 1, further comprising:
    forming at least one device in a second layer of semiconductor material, wherein the second layer of semiconductor material has not been exposed to ion implantation.

6. The method of claim 5, wherein the at least one device is a device from a group of devices consisting of a bipolar junction transistor, a field effect transistor, a capacitor, a resistor and a thyristor.

7. The a method of forming an integrated circuit in a wafer of semiconductor material, the method comprising:
    implanting ions through a first surface of the wafer to form a first amorphous layer adjacent the first surface of the wafer;
    annealing the wafer to convert the first amorphous layer to a first monocrystalline semiconductor layer;
    bonding a handle wafer to the first surface of the wafer; and
    forming semiconductor devices in a second layer of the wafer adjacent a second surface of the wafer, wherein the second layer has not been exposed to the ion implantation.

8. The method of claim 7, wherein annealing the wafer to convert the first surface of the wafer comprises:
    heating the wafer from 450° C. to 1200° for about 15 minutes to 8 hours.

9. The method of claim 7, wherein implanting the ions to form the first amorphous layer further comprises:

implanting ions of the semiconductor material of the wafer to form the first amorphous layer.

10. The method of claim 7, wherein bonding the handle wafer to the first surface of the wafer, further comprises:
forming an insulating bond layer on a surface of the handle wafer; and
bonding the insulating bond layer to the first surface of the wafer.

11. The method of claim 7, further comprising:
thinning the second layer of the wafer to a desired thickness.

12. The method of claim 11, wherein the method of thinning the second layer of the wafer to the desired thickness is a method from a group of methods consisting of etching, lapping, grinding and polishing.

13. The method of claim 7, wherein implanting the ions to form the first amorphous layer further comprises:
forming a oxide layer overlaying the first surface of the wafer; and
implanting the ions through the oxide layer.

14. The method of claim 13, further comprising:
removing the oxide layer after the implantation of ions.

15. The method of claim 7, further comprising:
forming a gettering zone between the first monocrystalline semiconductor layer and the second layer of the wafer.

16. The method of claim 15, wherein forming the gettering zone further comprises:
heating the wafer from 800° C. to 1200° for about 1 to 6 hours.

17. A method of forming an integrated circuit in a monocrystalline semiconductor wafer, the method comprising:
implanting ions through a first surface of the wafer to form a first layer of amorphous material adjacent the first surface of the wafer which extends a select depth from the first surface;
annealing the first layer of amorphous layer to form a first monocrystalline semiconductor layer;
forming a gettering zone containing active gettering sites between the first layer monocrystalline semiconductor material and a second layer of monocrystalline material, wherein the second layer of monocrystalline material has not been exposed to ion implementation;
bonding a handle wafer to the first surface of the wafer; and
forming devices in the second layer of monocrystalline material to form the integrated circuit.

18. The method of claim 17, wherein implanting the ions to form the first layer of amorphous material a select depth further comprises:
controlling the energy used to implant the ions.

* * * * *